United States Patent
Wohlfarth (10) Patent No.: US 6,348,785 B2
(45) Date of Patent: Feb. 19, 2002

(54) LINEAR RAMPING DIGITAL-TO-ANALOG CONVERTER FOR INTEGRATED CIRCUIT TESTER

(75) Inventor: Paul Dana Wohlfarth, Vernonia, OR (US)

(73) Assignee: Credence Systems Corporation, Fremont, CA (US)

( * ) Notice: Subject to any disclaimer, the term of this patent is extended or adjusted under 35 U.S.C. 154(b) by 0 days.

(21) Appl. No.: 09/773,168

(22) Filed: Jan. 30, 2001

Related U.S. Application Data (62) Division of application No. 09/425,277, filed on Oct. 21, 1999, now Pat. No. 6,232,759.

(51) Int. Cl.[7] .......................... G01R 31/02; G01R 1/04; H03K 17/00; H03B 21/00
(52) U.S. Cl. .................. 324/73.1; 324/158.1; 327/100; 327/105; 327/106; 327/107
(58) Field of Search .............................. 324/73.1, 158.1; 341/147; 714/738, 712, 724; 327/100, 105, 106, 107

(56) References Cited

U.S. PATENT DOCUMENTS

| | | | | |
|---|---|---|---|---|
| 3,764,995 A | * | 10/1973 | Helf, Jr. et al. | 714/32 |
| 4,044,244 A | * | 8/1977 | Foreman et al. | 714/724 |
| 4,316,178 A | * | 2/1982 | Shibayama et al. | 341/118 |
| 4,388,611 A | * | 6/1983 | Haferd | 341/122 |
| 4,419,656 A | * | 12/1983 | Sloane | 341/120 |
| 4,783,307 A | * | 11/1988 | Gallign et al. | 376/217 |
| 4,862,070 A | * | 8/1989 | Ostertag | 324/73.1 |
| 4,907,230 A | * | 3/1990 | Heller et al. | 714/724 |
| 5,059,892 A | * | 10/1991 | Stoft | 324/73.1 |
| 5,063,383 A | * | 11/1991 | Bobba | 341/120 |
| 5,132,685 A | * | 7/1992 | DeWitt et al. | 341/120 |
| 5,153,592 A | * | 10/1992 | Fairchild et al. | 341/118 |
| 5,198,785 A | * | 3/1993 | Jordan | 332/109 |
| 5,583,430 A | * | 12/1996 | Dinteman | 324/158.1 |

FOREIGN PATENT DOCUMENTS

JP 405075458 A * 3/1993 ............ H03M/1/10

* cited by examiner

*Primary Examiner*—Glenn W. Brown
*Assistant Examiner*—Wasseem H. Hamdan
(74) *Attorney, Agent, or Firm*—Daniel J. Bedell; Smith-Hill and Bedell

(57) ABSTRACT

An arbitrary waveform generator (AWG) generates an output signal that linearly ramps between discrete levels to approximate a smoothly varying waveform. The AWG includes a digital-to-analog converter (DAC) formed by a set of N ramp generators, with each ramp generator producing output currents that ramp at adjustable rates between discrete levels in response to a change in state of an input waveform data bit. The output currents of all N ramp generators of the DAC, which have separately weighted magnitude levels, are summed and converted to a proportional voltage to produce the AWG's output signal.

11 Claims, 7 Drawing Sheets

LINEAR RAMPING DIGITAL-TO-ANALOG CONVERTER FOR INTEGRATED CIRCUIT TESTER

CROSS-REFERENCE TO RELATED APPLICATION

This application is a divisional of U.S. patent application Ser. No. 09/425,277 filed Oct. 21, 1999, now U.S. Pat. No. 6,232,759 B1.

BACKGROUND OF THE INVENTION

1. Field of the Invention

The present invention relates in general to integrated circuit (IC) testers and in particular to a linear ramping digital-to-analog converter for generating test signal outputs for an IC tester.

2. Description of Related Art

An integrated circuit (IC) tester tests the logic of a digital IC by applying digital signals to its inputs and monitoring the IC's digital output signals to determine if they behave as expected. An IC tester usually includes a separate channel connected to each terminal of the IC, with each channel including a tristate driver and a data acquisition circuit. When the terminal is an input terminal, the driver sends it a square wave test signal abruptly changing between high and low logic levels at specific times during the test. When the terminal conveys an IC output signal the data acquisition circuit samples the IC output signal at various times during the test to determine whether it is of an expected logic state.

In a general purpose IC tester the driver's high and low logic levels are adjustable because the various ICs it may test have differing logic levels and because it is helpful to test an IC over a range of logic levels to determine its tolerance for variation in input logic level. Some testers use digital-to-analog converters (DACs) to produce reference voltages for controlling the driver's high and low output signal levels. A DAC produces an output voltage of magnitude proportional to the value of its digital input data, and when its input data value changes the DAC quickly steps its output voltage to a new level.

A tester employing one DAC to generate the high logic level and one DAC to generator the low logic level supplies the appropriate data to each DAC before the start of a test to set the desired high and low logic levels. The DAC output voltages are supplied to the channels' drivers for use as references when generating their output test signal. During a test the tester supplies a two-bit wide control data sequence to each driver. A "DRIVE" bit tells the driver when to switch its output signal between its high and low logic levels while the second bit (a "TRISTATE" bit) tells the driver when to tristate its output. The timing of the control data bits controls the timing of the state changes in the driver's output signal. A tester also supplies a separate data sequence to the comparator circuit for each channel to tell each comparator when to sample an IC output signal and to also indicate the expected logic state of the IC output signal.

A test is normally organized into a succession of test cycles of uniform duration. A tester typically employs one or more pattern generators for supplying a separate data word (a "vector") to each tester channel prior to the start of each test cycle. The vector indicates the test activity or activities the channel is to carry out during the test cycle and indicates times during the test cycle when the channel is to carry out those activities. A "formatter" circuit within each channel decodes the vector to produce the control data supplied to the channel's driver and data acquisition circuits during the test cycle. With regard to the driver, the vector indicates how and when during the test cycle the formatter is to change the state of the DRIVE and TRISTATE bits.

We can think of the pattern generator, the formatter, the driver and the level control DACs within each channel as forming a waveform generator producing a square wave output signal having levels controlled by the DACs and having edge timing controlled by the vector data sequence produced by the pattern generator. This waveform generator has a limited flexibility in producing an output waveform because while it can flexibly adjust timing of square wave edges, it can only set the square wave between the two discrete levels defined by its reference DAC outputs. In order to drive the test signal to other levels, the tester has to stop the test, supply new data to the DACs, and then restart the test.

It would be beneficial if the waveform generator were capable of providing a wider range of waveforms as test signal inputs to an IC. For example, to test an IC to determine its tolerance for noise in an input signal we would like to add high frequency simulated noise components of desired magnitudes to the square wave test signal. A conventional digital tester can't do that because its test signal output is limited to two levels.

Analog IC testers use an arbitrary waveform generator (AWG) to produce a waveform having any of a large number of magnitude levels. A simple arbitrary waveform generator includes a pattern generator supplying a data sequence as input to a DAC. By adjusting the nature and frequency of the data sequence supplied to the DAC we can make the DAC produce a "stepped" approximation of essentially any analog waveform we like within the resolution, range and frequency limitations of the DAC. The AWG output waveform is not smooth because the DAC can only produce discrete voltage levels, but if we increase the resolution of the DAC and the frequency with which we update its input data, its output signal voltage steps become smaller, and its output signal begins to more closely approximate a smoothly varying analog signal. However since high resolution, high frequency DACs are expensive, and since high frequency operation requires a pattern generator to produce a very long waveform data sequence at a high rate, there are practical limits to how close we can make a conventional, stepped AWG output signal approximate a smoothly varying analog signal.

One solution to smoothing the stepped output signal of a DAC is to pass it through an analog filter. Filtering the signal removes abrupt edges and make its more closely approximate a smoothly varying analog signal. Although arbitrary waveform generators are occasionally used to supply test signal inputs to digital integrated circuits, their use in generating signals having high frequency components is problematic. Although high frequency, high resolution AWGs are expensive, perhaps the most important limitation to their use in high frequency digital IC test applications relates to their output signal filters. An IC tester has to precisely time a test signal, but when we pass an AWG output signal through a filter, the filter time skews various frequency components by differing amounts and therefore distorts the signal. We can compensate for that distortion to some extent by the way we program the pattern generator, but-that is difficult to do. Also an AWG's output filter may have to be appropriately tuned to account for the desired frequency characteristics of the waveform the AWG produces. This means that a tester employing a conventional AWG would have to include a complicated tunable filter for each channel, and that filter may have to be retuned whenever the nature of the waveform it is to produce changes.

What is needed is an inexpensive, high resolution AWG for an integrated circuit tester that can produce an output waveform that closely approximates a smoothly varying high frequency analog signal without being filtered.

SUMMARY OF THE INVENTION

In accordance with one aspect of the invention, an arbitrary waveform generator (AWG) produces an output waveform that ramps, rather than steps, between discrete levels. Since the waveform does not have abrupt edges, it more closely approximates a smoothly varying waveform than a waveform that steps between discrete levels.

In accordance with another aspect of the invention, the AWG includes a pattern generator for generating an output sequence of N-bit waveform data words wherein a value of each waveform data word represents a corresponding level of the AWG output signal.

In accordance with a further aspect of the invention, the AWG includes a digital-to-analog converter formed by a set of N ramp generators, each receiving a separate bit of each waveform data word produced by the pattern generator and each producing an output signal that linearly ramps up or down between two discrete levels in response to a change in state of its input bit. The output signals of all N ramp generators are summed to produce an AWG output signal that linearly ramps between levels represented by successive waveform data words. When the output signal levels of the separate ramp generators differ in magnitude, each waveform data word may specify an AWG output signal level with high resolution.

It is accordingly an object of the invention to provide an arbitrary waveform generator that can supply a high frequency arbitrary waveform as input to an integrated circuit, wherein the shape and timing of the waveform can be easily and accurately controlled.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

DESCRIPTION OF THE PREFERRED EMBODIMENT(S)

IC Tester Architecture

A typical high speed digital integrated circuit (IC) tester tests the logic of an IC by applying square wave test signals to IC input terminals. The present invention relates to an improved IC tester that can provide not only square wave signals but signals of arbitrary waveform shapes as inputs to an IC. For example in order to test an IC's ability to tolerate noise a tester in accordance with the present invention may produce a square wave test signal upon which it has superimposed an oscillating signal component simulating various noise levels and frequencies. Or, as another example, the IC tester of the present invention can be used to test analog ICs by producing test signals simulating sine wave or other smoothly varying signals.

Figure 1:
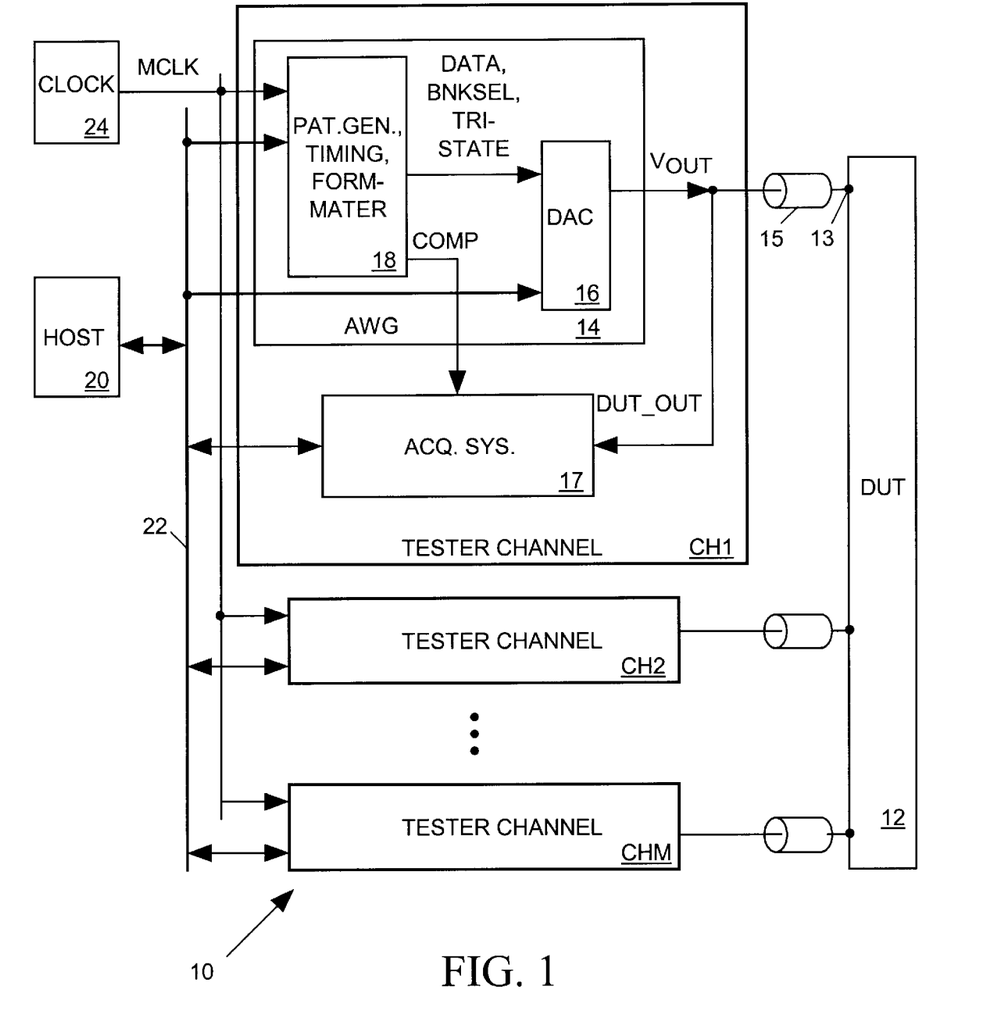
FIG. 1 is block diagram illustrating an integrated circuit tester in accordance with the present invention.

FIG. 1 illustrates an integrated circuit (IC) tester 10 in accordance with the invention for testing an IC device under test (DUT) 12. Tester 10 includes a set of channels CH1–CHM, each capable of generating and transmitting a test signal $V_{OUT}$ to a DUT input terminal 13 and of monitoring a DUT output signal to determine how the DUT responds. Each channel CH1–CHM employs an arbitrary waveform generator(AWG) 14 in accordance with the invention for producing a test signal $V_{OUT}$ closely approximating any of a wide variety of square wave or smoothly varying waveforms.

Each channel CH1–CHM also includes a conventional data acquisition circuit 17 for sampling a DUT output signal DUT_OUT appearing at a DUT terminal 13 to determine its state or magnitude. Acquisition circuit 17 may store sample data in a memory to be later read by a host computer 20 via lines of a bus 22 or may compare sampled DUT output signal states to expected states and report DUT output signal errors back to host computer 20 via bus 22.

Each AWG 14 uses a digital-to-analog converter (DAC) 16 to produce its output signal $V_{OUT}$. In accordance with the invention DAC 16 may be programmed to linearly ramp Vow between discrete output signal levels in response to changes in value of input a waveform data word (DATA) produced by pattern generator, timing and formatting circuits (PGTF) 18 forming another portion of AWG 14. Since the DAC output signal $V_{OUT}$ moves linearly between discrete current levels, it may closely approximate smoothly varying analog waveforms without having to be filtered. When tester 10 is to carry out a digital test on DUT 12, DAC 16 may be configured to quickly ramp its output signal $V_{OUT}$ between two signal levels in response to changes in input data so that $V_{OUT}$ acts as a square wave logic signal having highly controllable rise and fall times.

A test is organized into a succession of test cycles of uniform duration, each test cycle being marked by a pulse of a periodic master clock signal MCLK produced by a central clock source 24 at the start of the test cycle. Before the start of a test, a host computer 20, connected to the PGTF 18 of each channel CH1–CHM via a conventional data bus 22, programs each PGTF 18 to generate an output sequence of data words in response to successive pulses of the master clock signal. Some fields (DATA, BNKSEL, and TRISTATE) of each data word tell DAC 16 how to change its output signal $V_{OUT}$ magnitude during the following test cycle. The DATA field is an N-bit waveform data word indicating the level to which VOW, is to change and the BNKSEL field controls the rate at which DAC 16 is to slew to the new level and other DAC operating parameters as described below. DAC 16 is also capable of tristating its output signal (i.e. not driving the DUT 12 input terminal) when DUT 12 is producing an output signal to be monitored by acquisition system 17. The one-bit TRISTATE field tells DAC 16 when to tristate its output signal. Another field (COMP) of the PGTF output data controls data acquisition circuit 17, telling it when, if at all, during the test cycle it is to sample a DUT output signal. The COMP data may also indicate an expected logic level for the sampled DUT output signal.

After programming PGTF 18 and writing control data into DAC 16, host computer 20 signals the PGTF 18 of all channels CH1–CHM to begin producing their output data patterns in response to the MCLK signal. The waveform data word DATA that PGTF 18 supplies to DAC 16 tells it the magnitude to which it is to change its $V_{OUT}$ signal during the test cycle following the MCLK signal. The programming data host computer 20 supplies to PGTF 18 before the start of the test not only indicates the value of each output pattern data word it's to produce for each test cycle, it also tells the PGTF when during each cycle the data word is to be generated. Thus PGTF 18 precisely controls the timing with which DAC 16 changes its output signal $V_{OUT}$ magnitude during each test cycle.

During a test, DAC 16 can change its operating characteristics (i.e. change the way it responds to each value of DATA) for example by selecting a new output signal range, changing from a square wave to ramping mode of operation, or changing the rate at which its output signal ramps between levels. Before the start of a test, host computer 20 sends a separate set of control data for each expected mode of DAC 16 operation to a bank of registers within DAC 16 via bus 22. Thereafter, during the test, the BNKSEL output data field of PGTF 18 selects the particular register within DAC 16 containing data that is to control the DAC's operating characteristics. Host computer 20 also sends timing calibration data to DAC 16 for adjusting the timing of its response to its input data from PGTF 18 so that the timing of output signals of all channels CH1–CHM are tightly coordinated.

DAC Architecture

Figure 2:
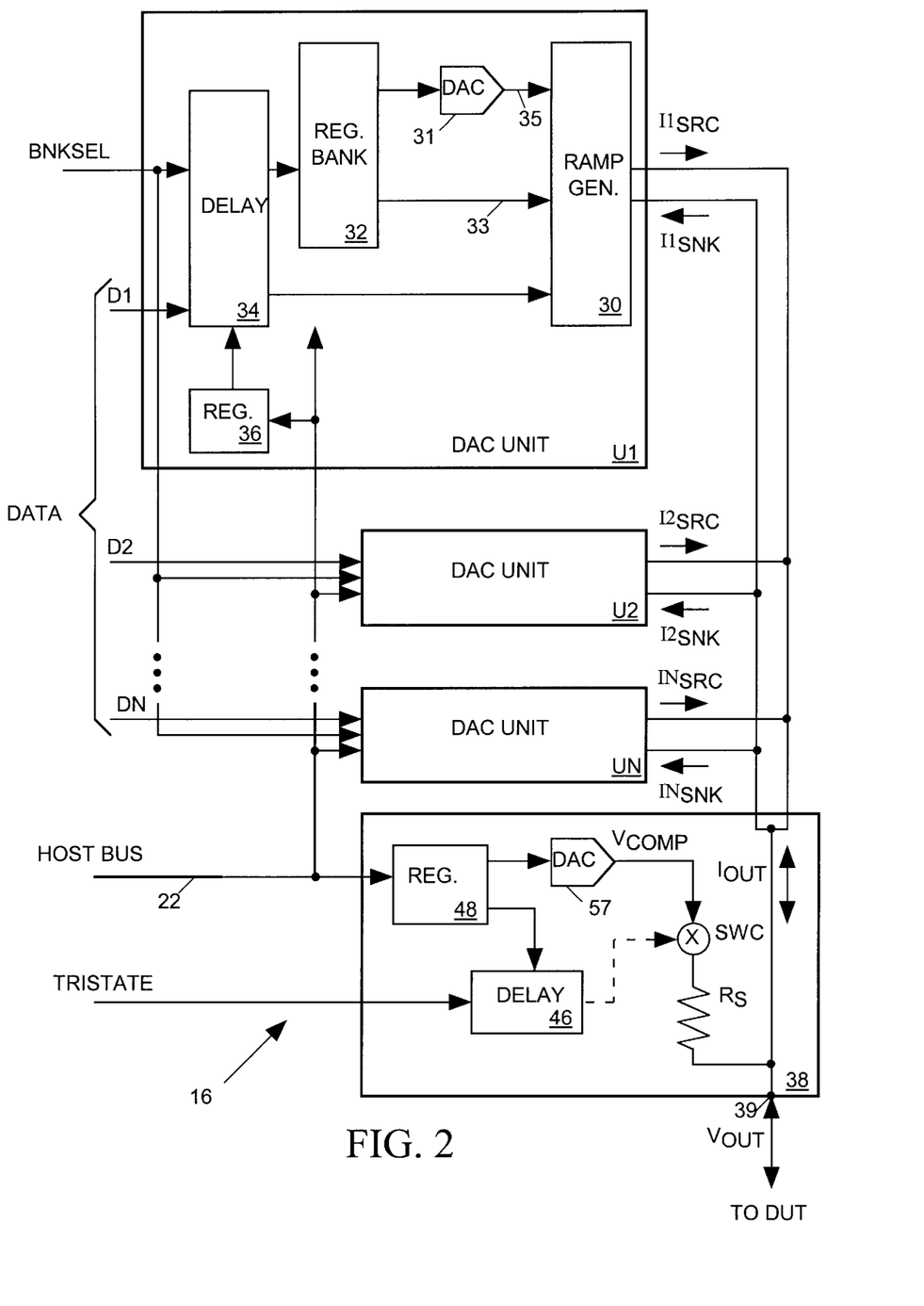
FIG. 2 illustrates the digital-to- analog converter (DAC) of FIG. 1 in more detailed block diagram form.

FIG. 2 illustrates DAC 16 of FIG. 1 in more detailed block diagram form. DAC 16 includes a set of N 1-bit DAC units U1–UN, one for each of the N bits D1–DN of the waveform data word DATA generated by PGTF 18 of FIG. 1. All DAC units U1–UN are similar; FIG. 2 details only DAC unit U1. DAC unit U1 includes a ramp generator 30 receiving one bit D1 of the incoming waveform DATA word and producing as output a pair of currents $I1_{SRC}$ and $I1_{SNK}$. "Source" $I1_{SRC}$ flows outward from DAC unit U1 while "sink" current $I1_{SNK}$ flows into the DAC unit. When the D1 bit changes from a logical 0 to a logical 1, ramp generator 30 changes source current $I1_{SRC}$ upward from a low level to a high level and changes sink current $I1_{SNK}$ downward from a high level to a low level. Ramp generator 30 changes each output currents $I1_{SRC}$ and $I1_{SNK}$ in an opposite direction when D1 changes from a 1 to a 0.

A register bank 32 stores control data defining characteristics of the output signals $I1_{SRC}$ and $I1_{SNK}$ signals of ramp generator 30 including magnitudes of their high and low levels and the rate at which they change between those levels. Some fields of the control data stored in register bank 32 directly control ramp generator 30. A set of DACs 31 convert other fields of the control data output of register bank 32 to control voltage and current signals supplied to ramp generator 30. Register bank 32 may store several complete sets of control data, one in each of its several addressable registers. Host computer 20 of FIG. 1 may write sets of control data to a register bank 32 via bus 22 with each set of control data defining a different set of ramp generator output signal characteristics. During a test, the BNKSEL data addresses one of the registers of register bank 32 causing it to read out one portion of its stored control data as digital control signal inputs 33 to ramp generator 30 and to read out another portion of its stored control data to a set of DACs 31. The DACs 31 produce analog control signal inputs 35 to ramp generator 30. As detailed below, control signals 33 and 35 directly control the slope and starting and ending signal levels of the output signals $I1_{SRC}$ and $I1_{SNK}$ signals of ramp generator 30. Thus during a test, PGTF 18 may change the slope and signal levels of $I1_{SRC}$ and $I1_{SNK}$ by changing the value of its BNKSEL output data field supplied to register bank 32.

A delay circuit 34 delays the arrival of DATA bit D1 at the input of ramp generator 30 and delays the arrival of the BNKSEL data at register bank 32 by an amount of time determined by a data output of a register 36. Host computer 20 of FIG. 1 can adjust the delay of delay circuit 34 by writing data into register 36 via bus 22, thereby adjusting the timing of arrival of the data bit input to each DAC unit of each tester channel. By appropriately adjusting the delay of the delay circuit 34 of each DAC unit, host computer 20 can compensate for differences in MCLK signal distances between clock source 24 and each PGTF, and for differences in DATA and BNKSEL signal path distances between the PGTF 18 and each DAC unit U1–UN. This allows tester channels CH1–CHM to reside on separate circuit boards that may be of varying distance from clock source 24 and allows separate subgroups of the DAC units U1–UN forming each DAC 16 to reside within two or more integrated circuits that may be of differing DATA and BNKSEL signal path distances to PGTF 18.

An output stage 38 sums all of the source and sink currents $I1_{SRC}$–$IN_{SRC}$ and $I1_{SNK}$–$IN_{SNK}$ produced by DAC units U1–UN to produce a net current $I_{OUT}$. Output stage 38 includes a DAC 57 connected to an output terminal 39 via a switch SWC and a terminating resistor $R_S$. DAC 57 produces an output voltage $V_{COMP}$ in response to data host computer 20 (FIG. 1) writes into a register 48 via bus 22 before the start of the test. Switch SWC is normally closed when DAC 16 is driving a DUT input terminal. When the input impedance of DUT 12 is much higher than the impedance of terminating resistor $R_S$, substantially all of $I_{OUT}$ flows through $R_S$. The DAC output voltage $V_{OUT}$ is the product of the magnitudes of $I_{OUT}$ and $R_S$ offset by $V_{COMP}$. Thus $V_{OUT}$ ramps in proportion to $I_{OUT}$ with an offset controlled by $V_{COMP}$.

The output of DAC 16 may be tristated by opening switch SWC output stage 38 and setting $I_{OUT}$ to 0. The TRISTATE bit input to DAC 16 controls switch SWC. A delay circuit 46 delays the TRISTATE bit output of PGTF 18 (FIG. 1) before it arrives at switch SWC. Host computer 20 (FIG. 1) writes data into a register 48 via bus 22 to adjust the delay of delay circuit 46 in order to calibrate the timing of arrival of the TRISTATE signal at output stage 38 to compensate for variations in TRISTATE signal path distance between DAC units of the various tester channels.

DAC 16 can also provide a desired load for terminating an output signal produced by DUT 12. Instead of tristating the DAC output by opening switch SWC, the switch remains closed with $I_{OUT}$ set to a desired value. The $V_{COMP}$ voltage output of DAC 57 is also set to a desired level so that specified load may be presented to the DUT output signal.

As mentioned above, in response to each change of state of its input data bit D1 at the start of a test cycle, ramp generator 30 swings each of its output signals $I1_{SRC}$ and $I1_{SNK}$ in opposite directions between two levels. The control data output of register bank 32 defines not only the high and low current levels of each output signal $I1_{SRC}$ and $I1_{SNK}$, it also controls the rate at which ramp generator 30 changes its output signals between those two levels. When the DAC 16 output signal $V_{OUT}$ is to be a square wave signal, with edges changing quickly between levels during a test cycle, the control data and signal input to the ramp generator 30 of each DAC unit U1–UN may set its ramping rate to a maximum value so that their output source and sink current signals $I1_{SRC}$–$IN_{SRC}$ and $I1_{SNK}$–$IN_{SNK}$ ramp as quickly as possible after each change in state of input data bit D1–DN, thereby closely approximating square waves. Since $I_{OUT}$ is the sum of the source and sink currents of all DAC units U1–N, it will also have abrupt edges. During this mode of operation PGTF 18 may change the DATA value at input to DAC 16 at any selected time during a test cycle thereby flexibly timing placement of an edge of the test signal $V_{OUT}$ within each test cycle.

When DAC 16 output signal $V_{OUT}$ is to approximate a smoothly varying analog signal or a "square wave" signal with closely controlled rise and fall times, PGTF 18 may be programmed to change the state of the waveform data word (DATA) input to DAC 16 only at the start of each test cycle. The control data output of the register bank 32 of each DAC unit U1–UN sets the DAC unit's ramp generator to change its output source and sink currents from one level to another at a slower rate requiring a full test cycle for the source and sink signals to ramp linearly between their two levels. Thus at the end of each test cycle the output currents of all DAC units U1–UN have reached their high or low levels as determined by the states of their input data bits D1–DN. When one or more bits D1–DN of the DATA word for the next test cycle differ from corresponding bits of the preceding DATA word, the ramp generator 30 within each unit U1–UN begins to linearly ramp its output source and sink currents to their opposite levels. The control signals from DACs 31 set the rate at which each DAC unit ramps its output source and sink currents so that they reach their new levels precisely at the start of the next test period. The current $I_{OUT}$, being the sum of the linearly ramping DAC unit output source and sink currents, therefore also linearly ramps during the entire test cycle between two levels represented by the two successive waveform data words. Thus during each test cycle, the DAC 16 output signal $V_{OUT}$, being proportional to $I_{OUT}$, remains at a constant level (when the DATA word for that test cycle has the same magnitude as the DATA word for the preceding test cycle) or linearly ramps up or down during the entire test cycle between the two levels represented by the successive DATA words.

The resolution with which $V_{OUT}$ magnitudes can be controlled improves when we increase the number N of DAC units U1–UN. The control data stored in each register bank 32 can be set so that the source and sink current output levels differ from DAC unit to DAC unit. Suppose for simplicity that we have three DAC units U1–U3 (i.e., N=3) and that we assign relative weighting 1, 2 and 4 to the three DAC units U1–U3 output current levels. For example, we may set $I1_{SRC}$ and $I1_{SNK}$ to ramp between 0 and 1 mA, $I2_{SRC}$ and $I2_{SNK}$ to ramp between 0 and 2 ma, and set $I3_{SRC}$ and $I3_{SNK}$ to ramp between 0 and 4 mA. Then when a data bit D1, D2 or D3 changes from 0 to 1, the corresponding source current ramps from 0 to 1, 2 or 4 mA and the corresponding sink current ramps from –1, –2 or –4 to 0. (The negative sign in the sink current magnitude is chosen because sink currents flow in a direction opposite to that of the source currents.) Since the $I_{OUT}$ current is the sum of all ramp currents, we have the following possibilities for load current $I_{OUT}$ at the end any a ramp cycle beginning with the any of the 3- bit DATA word values:

TABLE I

| DATA | $I1_{SRC}$ | $I1_{SNK}$ | $I2_{SRC}$ | $I2_{SNK}$ | $I3_{SRC}$ | $I3_{SNK}$ | $I_{OUT}$ |
|------|------------|------------|------------|------------|------------|------------|-----------|
| 111  | 1 | 0 | 2 | 0 | 4 | 0 | 7 |
| 011  | 0 | –1 | 2 | 0 | 4 | 0 | 5 |
| 101  | 1 | 0 | 0 | –2 | 4 | 0 | 3 |
| 001  | 0 | –1 | 0 | –2 | 4 | 0 | 1 |
| 110  | 1 | 0 | 2 | 0 | –4 | 0 | –1 |
| 010  | 0 | –1 | 2 | 0 | –4 | 0 | –3 |
| 100  | 1 | 0 | 0 | –2 | –4 | 0 | –5 |
| 000  | 0 | –1 | 0 | –2 | –4 | 0 | –7 |

Thus we see from Table I that $I_{OUT}$ may range from –7 mA to 7 mA in steps of 2 mA depending on the value of the DATA word. The value of DAC output signal $V_{OUT}$ thus ranges from $(-7R_S+V_{COMP})$ to $+7R_S+V_{COMP}$ when R is very much smaller than the input impedance of DUT 12. In this example $I_{OUT}$ does not have a 0 value. If we would like to have a DATA word value that produces a $V_{OUT}$ value of 0, we can adjust the value of $V_{COMP}$ as necessary to provide at least one value in which $V_{OUT}$=0. Alternatively, when we chose 0 as a value of $V_{COMP}$, we can adjust the control data in the register bank 32 of each DAC unit to provide a +1/6 mA offset in all source and sink currents high and low levels. For example $I1_{SRC}$ would then range between 1/6 and 7/6 mA while $I1_{SNK}$ would range between –5/6 mA and +1/6 mA. The resulting $I_{OUT}$ current will then have one the following set of possible values at the end of each test cycle depending on DATA word value provided at the start of the test cycle: {–6, –4, –2, 0, 2, 4, 6 and 8).

By increasing the number N of bits in the DATA word and DAC units U1–UN, we increase the resolution with which DAC 16 can control the magnitude of $V_{OUT}$. For example when N=8, and we use a similar binary weighting pattern for the DAC unit output currents (i.e., 1, 2, 4, 8, . . . 128), we can control $V_{OUT}$ with a resolution of 1 in $2^8$. It should be apparent that other weighting schemes can be employed, for example to provide a resolution that varies with $V_{OUT}$ magnitude.

Figure 3:
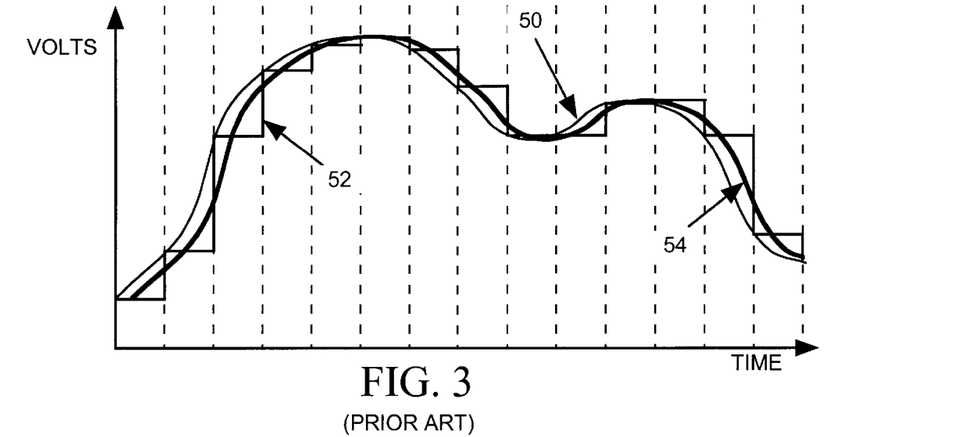
FIG. 3 is a waveform diagram comparing an analog waveform to filtered and unfiltered versions of the output of a typical prior art arbitrary waveform generator.

FIG. 3 is a waveform diagram comparing a smoothly varying analog waveform 50 to an unfiltered version 52 and a filtered version 54 of the output voltage of a conventional prior art AWG attempting to synthesize analog waveform 50. Since a conventional prior art AWG changes its output voltage abruptly, its unfiltered output waveform 52 has a stepped appearance and only roughly approximates the desired shape of waveform 50. When an appropriately tuned filter filters the AWG output waveform 52, the resulting filtered waveform 54 more closely approximates the shape of waveform 50. However the filter distorts the waveform because it time skews the various frequency components of the signal by differing amounts.

Figure 4:
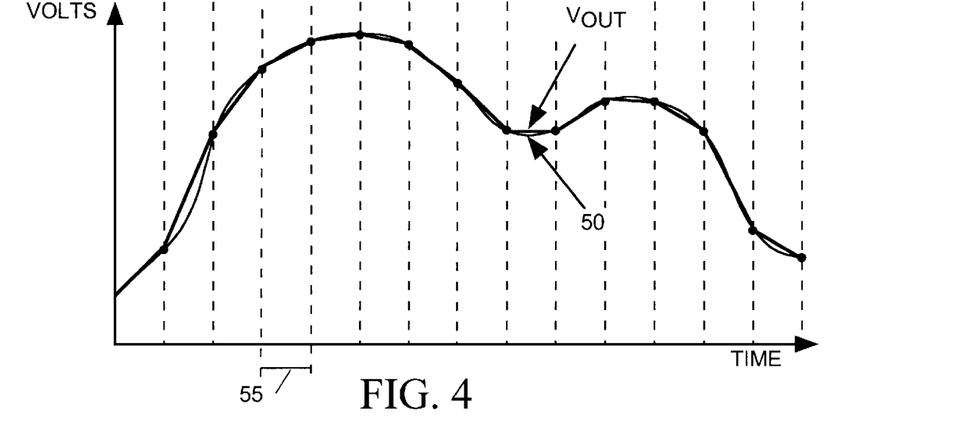
FIGS. 4 and 5 are waveform diagrams comparing an analog waveform to outputs of the DAC of FIG. 2.

FIG. 4 is a waveform diagram comparing the smoothly varying analog waveform 50 appearing in FIG. 3 to the output $V_{OUT}$ of AWG 16 of FIG. 2 when programmed to simulate waveform 50. Note that while $V_{OUT}$ varies in a piece-wise linear fashion during each test cycle 55, it nonetheless closely approximates waveform 50 without having to be filtered, and therefore has no filter-related time skew distortion.

Figure 5:
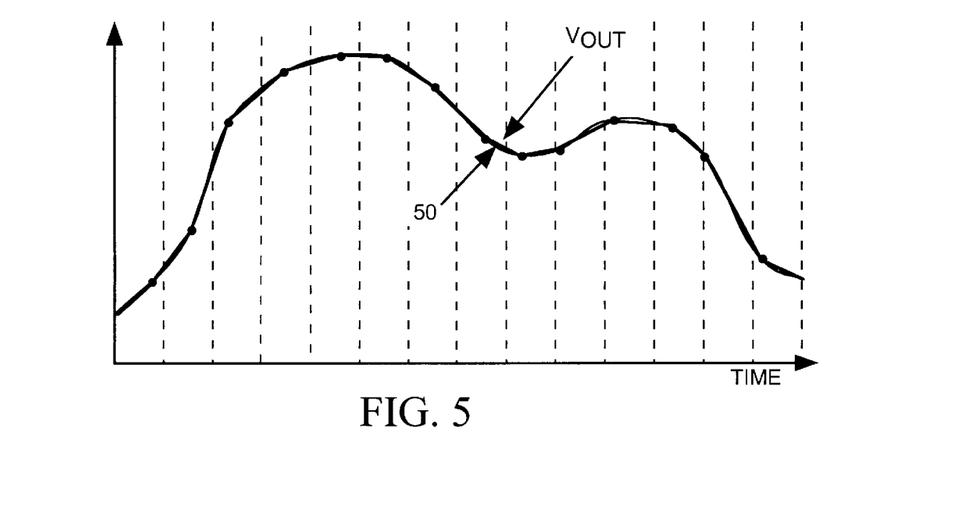

In producing the $V_{OUT}$ waveform of FIG. 5, PGTF 18 was limited to changing the waveform DATA word input only at the start of each test cycle and did not change its BNKSEL data output from test cycle-to-cycle. FIG. 5 illustrates how $V_{OUT}$ can approximate waveform 50 when we program PGTF 18 to appropriately adjust the timing of DATA word value changes within each test cycle and to set the BNKSEL data when it changes the DATA word value to select an appropriate ramping rate for $V_{OUT}$. Note $V_{OUT}$ now very closely approximates waveform 50. We can make the $V_{OUT}$ waveform still more closely approximate waveform 50 by decreasing the test cycle period and increasing the resolution DAC 16.

As may be discerned by comparing FIGS. 3–5, the AWG 14 of FIG. 1 employing the "piece-wise linear" ramping DAC 16 in accordance with the invention is more suitable for use as a test signal source in an IC tester channel than an AWG employing a conventional DAC having a stepped output because the output waveform of DAC 16 need not be filtered to provide a relatively close approximation of a smoothly varying analog signal. An IC tester must precisely time a test signal, but as discussed above 3, when we pass a stepped AWG output signal through a filter, the filter time skews and distorts the signal. Although we can compensate for that time skew and distortion by the way we program a conventional AWG, is difficult to do. Also a conventional AWG's output filter may have to be appropriately tuned to account for the desired frequency characteristics of the waveform the AWG produces. This means that the IC tester would have to include a complicated tunable filter for each channel, that may have to be retuned whenever the nature of the waveform it produces changes. The filter tuning requirement would make it difficult for such a tester to significantly change the nature of an output waveform on the fly during a test. Since the output of DAC 16 need not be filtered in order to provide an close approximation of a smoothly varying analog signal, the problems associated with filtering the test signal waveform are eliminated.

Multiple IC DAC Architecture

Figure 6:
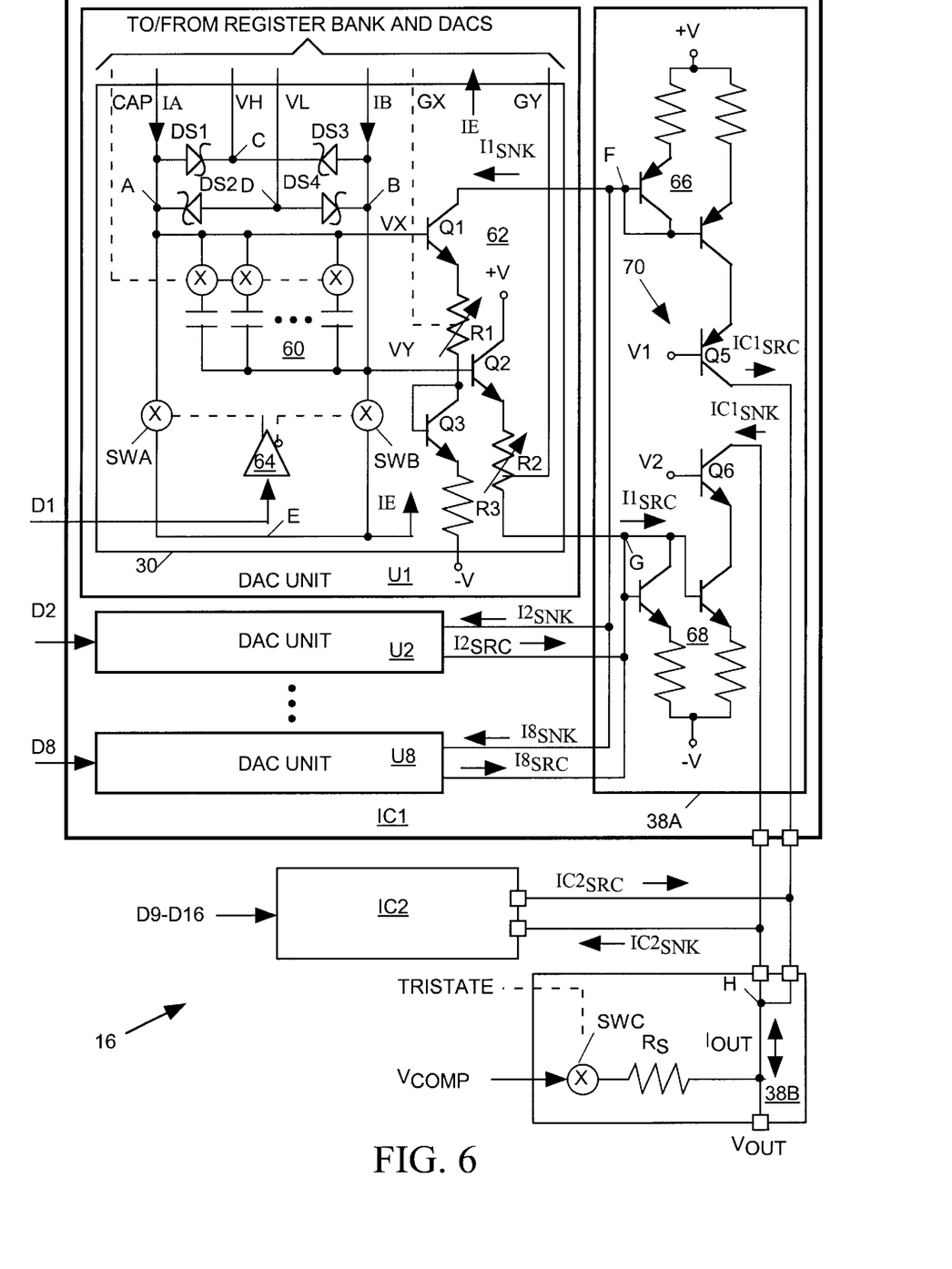
FIG. 6 is a block and schematic diagram illustrating how components of the DAC of FIG. 2 may be partitioned between two integrated circuits.

FIG. 6 details a 16-bit version of DAC 16 of FIG. 2 employing 16 single bit DAC units implemented in two separate but similar integrated circuits IC1 and IC2. For simplicity, the BNKSEL and computer bus 22 inputs, DACs 31, register bank 32, registers 36 and 48, delay circuits 34 and 46 and DAC 57 appearing in FIG. 2 are not shown in FIG. 6. Integrated circuit IC1 implements DAC units U1–U8 responding to input data bits D1–D8 while IC2 implements an additional eight DAC units responding to input data bits D9–D16. IC1 and IC2 also implement a portion 38A of output stage 38 of FIG. 2 while another portion 38B of output stage 38 is implemented external to both IC's IC1 and IC2.

DAC unit U1, representative of all DAC units in both ICs, includes the ramp generator 30 appearing in FIG. 2. Ramp generator 30 includes a set of four Schottky diodes DS1–DS4 with diode DS1 connected between circuit nodes A and C, DS2 between circuit nodes D and A, DS3 between nodes B and C and DS4 between nodes D and B. A switch SWA links node A to node E and a switch SWB links node B to node E. Two of DACs 31 of FIG. 2 act as current sources supplying adjustable currents IA and IB into node A and B while another of DACs 31 acts as a current sink drawing a current IE from node E. Other DACs 31 provide supply voltages VH and VL to nodes C and D, respectively.

A switched capacitor bank 60 is connected between nodes B and C. An amplifier 64 converts the input data bit D1 to a differential signal that alternatively closes either SW1 or SW2 depending on the state of the D1 bit. Register bank 32 4 of FIG. 2 supplies a control data input CAP to capacitor bank 60 for selecting the amount of capacitance applied across nodes A and B. When ramp generator 30 is to produce square wave output signals, the CAP data may disconnect all capacitors of bank 60 from node A so that there is little capacitance between nodes A and B, or the CAP data may connect a particular amount of capacitance so as to precisely control the rise and fall times of the square wave edges. When ramp generator 30 is to produce ramping output signals, the CAP data connects selected capacitors of bank 60 to node A to provide a capacitance across nodes A and B. As the capacitance between nodes A and B increases, the rate at which the ramp generator output signals change decreases.

When SWA opens and SWB closes, current IA charges the capacitor bank 60 capacitance currently connected between nodes A and B causing the voltage VA of node A to ramp linearly upward until it rises above VH, thereby forward biasing diode D1. At the same time, the voltage VB of node B falls linearly until it falls below VL, thereby forward biasing diode D4. Conversely when SWA closes and SWB opens, current IB charges the capacitance of capacitor bank 60 causing voltage VB to ramp linearly upward until it rises above VH, thereby forward biasing diode D3. At the same time the voltage VA falls linearly until it falls below VL, thereby forward biasing diode D2. Thus depending on the direction of state change of D1, voltages VX and VY ramp linearly in opposite directions between upper and lower limits established by VH and VL. An amplifier 62 formed by a set of transistors Q1–Q3 and resistors R1–R3 converts the VX and VY ramping voltage signals into corresponding ramping current signals $I1^{SRC}$ and $I1_{SNK}$. Control data GX and GY stored in register bank 32 of FIG. 2 selects the gain of amplifier 62 when converting VX into output sink current $I1_{SNK}$ and VY into output source current $I1_{SRC}$ by adjusting the resistance of adjustable resistors R1 and R2, respectively, to further adjust output signal levels.

In addition to DAC units U1–U8, integrated circuit IC1 also includes an amplifier 38A (forming a portion of output stage 38 of FIG. 2) including two current mirrors 66 and 68 and an output cascode amplifier 70. The current output $I1_{SNK}$ of DAC unit U1, along with similar sink current outputs $I2_{SNK}$–$I8_{SNK}$ of DAC units U2–U8 are applied to an input node F of current mirror 66. Current mirror 66 produces the output source current $IC1_{SRC}$ of integrated circuit IC1 equal to the sum of sink currents $I1_{SNK}$–$I8_{SNK}$. $IC1_{SRC}$ passes through a transistor Q5 of cascode state 70. Similarly, the $I1_{SRC}$ current output of DAC unit U1, along with similar source current outputs $I2_{SRC}$–$I8_{SRC}$ of DAC units U2–U8 are applied to input node G of current mirror 68 producing an output source current $IC1_{SRC}$ of integrated circuit IC1 equal to the sum of sink currents $I1_{SNK}$–$I8_{SNK}$ passing though transistor Q6 of cascode amplifier 70. Fixed bias voltages V1 and V2 drive the bases of transistors Q5 and Q6.

The output source and sink currents $IC1_{SRC}$ and $IC1_{SNK}$ of IC1 are summed with output source and sink currents $IC2_{SRC}$ and $IC2_{SNK}$ of IC2 at a node H of output stage 38B to produce current $I_{OUT}$ through termination resistance $R_S$ to develop the DAC output voltage $V_{OUT}$ supplied through transmission line 40 to an input terminal of DUT 12. The switch SWC within output stage 38B controlled by the TRISTATE signal selectively connects the $V_{COMP}$ signal from DAC 57 (FIG. 2) to node H via a resistor R4. The impedance of $R_S$ is suitably chosen to match the impedance ZO of the transmission line 15 (FIG. 1) 40 linking node H to input terminal 13 of DUT 12. The TRISTATE signal tristates the output of DAC 16 by opening switch SWC with $I_{OUT}$ set to 0 and $V_{COMP}$ matching any voltage between the DUT's input impedance and ground. In such case, DAC 16 does not drive the load and the test signal output $V_{OUT}$ of DAC 16 is effectively tristated.

From the foregoing discussion it should be understood that the VH and VL voltage outputs of DACs 31 and the GX and GY data outputs of register bank 32 of each DAC unit U1–U8 together control the high and low levels of the $I1_{SRC}$ and $I1_{SNK}$ output signal ramps. These high and low current levels are set to separately determine the weighting given to the output current of each DAC unit. The relative weighting of currents between DAC units of IC1 and IC2 can be distributed so as to balance the current loads carried by IC1 and IC2. For example when we set the eight DAC units of IC1 to provide relative output current weighting of the set $\{2^0, 2^1, 2^2, 2^3, 2^{12}, 2^{13}, 2^{14}, 2^{15}\}$ and set the eight dac units of IC2 for relative weighting of the set $\{2^4, 2^5, 2^6, 2^7, 2^8, 2^9, 2^{10}, 2^{11}\}$, then IC1 and IC2 will produce the same maximum total output current magnitudes, thereby balancing the loads the two ICs must carry.

The IA, IB and IE control currents the CAP control data produce by DACs 31 and register bank 32 of FIG. 2 control the rate at which output currents $I1_{SRC}$ and $I1_{SNK}$ ramp between their high and low levels. To produce ramping output signals IA, IB and IC and CAP data values are set the $I1_{SRC}$ and $I1_{SNK}$ currents require the entire period between successive changes in DATA word value, to linearly ramp between their high and low levels.

DAC 16 of FIG. 6 can be expanded for higher resolution by increasing the number of DAC units per IC or by connecting the source and sink current outputs of one or more additional ICs (similar to IC1) to the input terminals of output stage 38 and appropriately adjusting the weighting of all DAC units.

Single-ended DAC Architecture

Figure 7:
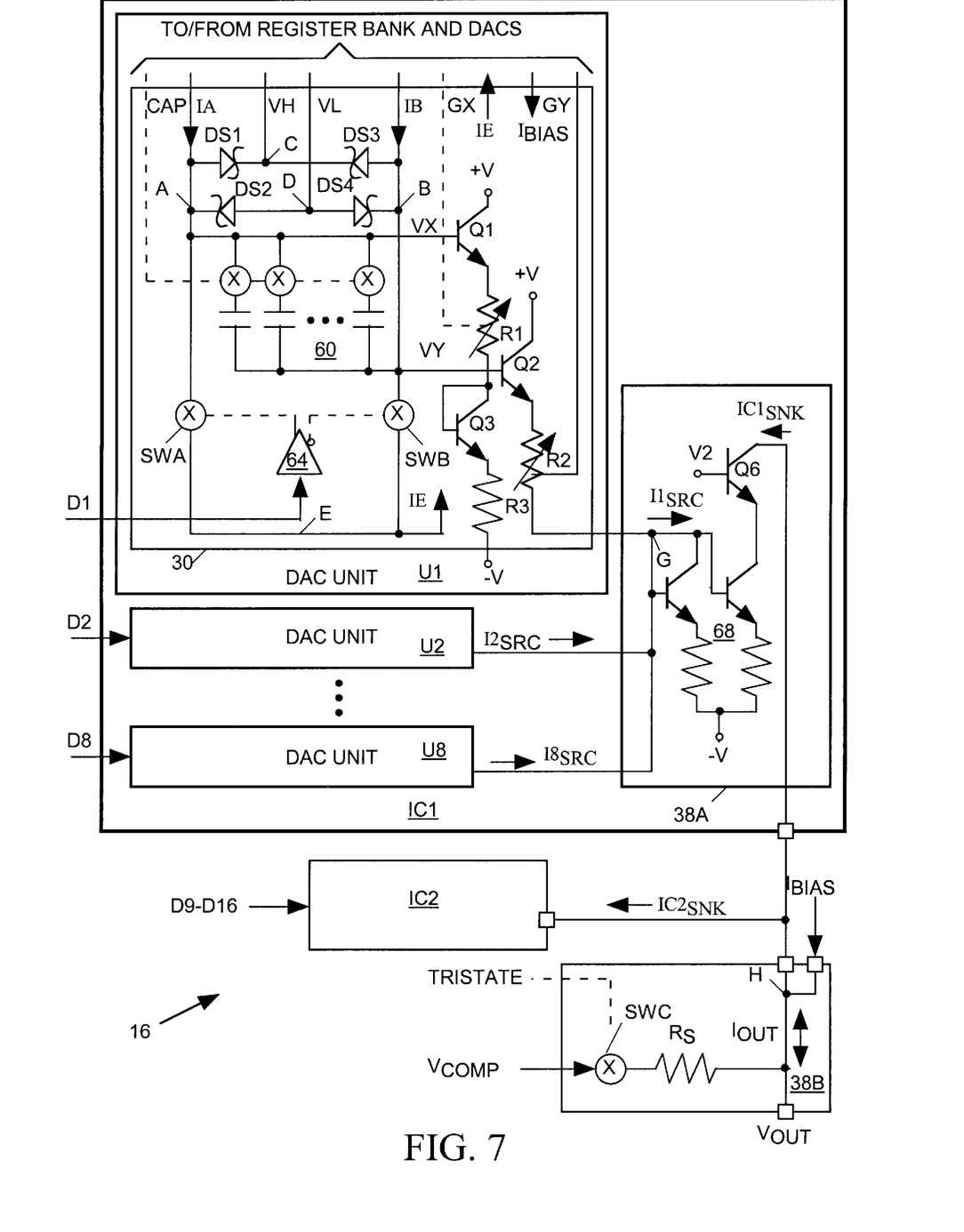
FIG. 7 is a block and schematic diagram of a single-ended DAC in accordance with the invention.

While in the preferred embodiment of the invention DAC 16 of FIGS. 2 and 6 are implemented as differential circuits in which each DAC unit U1–UN produces two output source and sink currents that ramp opposite direction, those skilled in the art will understand that in an alternative embodiment of the invention could be implemented as a single-ended circuit as shown in FIG. 7 in which each DAC U1–UN unit produces only a single output current. The design and operation of the single-ended circuit of FIG. 7 is analogous to the portion of the double-ended circuit of FIG. 6 that produces source currents $IC1_{SNK}$ and $IC2_{SNK}$. Since the DAC units U1–U8 within IC1 and IC2 can only produce sink currents, a constant bias current $I_{BIAS}$ produced by one of DACs 31 of FIG. 2 is provided as an additional input to terminal H of output stage 38B that may be suitably adjusted so that $I_{OUT}$, and therefore $V_{OUT}$, range over both positive and negative values.

Pattern Generator/Timing Formatter Architecture

Figure 8:
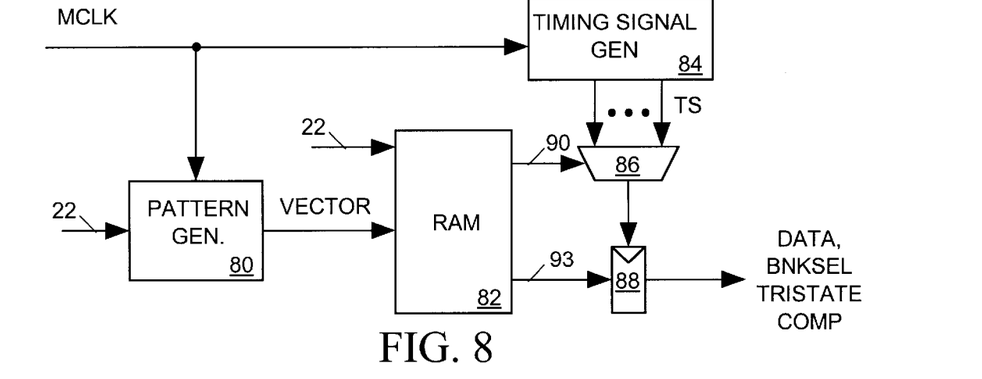
FIG. 8 illustrates the pattern generator, timing generator and formatter circuit of FIG. 1 in more detailed block diagram form.

FIG. 8 illustrates pattern generator/timing formatter circuit 18 of FIG. 1 in more detailed block diagram form. A conventional pattern generator 80 programmed by host computer 20 of FIG. 1 generates data word (VECTORs) in response to each pulse of the MCLK signal. A RAM 82 storing data from host computer 20 via bus 22 receives the VECTOR output of pattern generator 80 as an input read address and reads out data stored at its addressed storage location. A conventional timing signal generator 84 clocked by the MCLK signal produces a set of timing signals TS that are distributed in phase so that their edges divide the period between successive pulses of MCLK into several equal subdivisions. A multiplexer 86 controlled by a first field 90 of the data read out of RAM 82 delivers one of the timing signals TS to the clock input of a latch 88. Latch 88 latches the second field 92 of the data output of RAM 82 to produce the PGTF 18 output data fields DATA, BNKSEL, TRISTATE, and COMP. Thus RAM 82 decodes the VECTOR supplied at the start of each test cycle to not only produce the output data fields (DATA, BNKSEL, TRISTATE and COMP) supplied to DAC 16 and acquisition circuit 17 of FIG. 1, but to also produce data 90 that determines the time during the test cycle that those output data fields are to be supplied to DAC 16 and acquisition circuit 17.

AWG-driven Acquisition System Architecture

As discussed above, the conventional acquisition system 17 of tester channel CH1 of FIG. 1 samples the digital output signal DUT_OUT of DUT 12 at various times during a test cycle to determine whether the DUT_OUT signal is of an expected state. The COMP data input to acquisition system 17 tells acquisition system 17 when during any test cycle it is to sample the digital DUT_OUT signal and also indicate the expected state.

Figure 9:
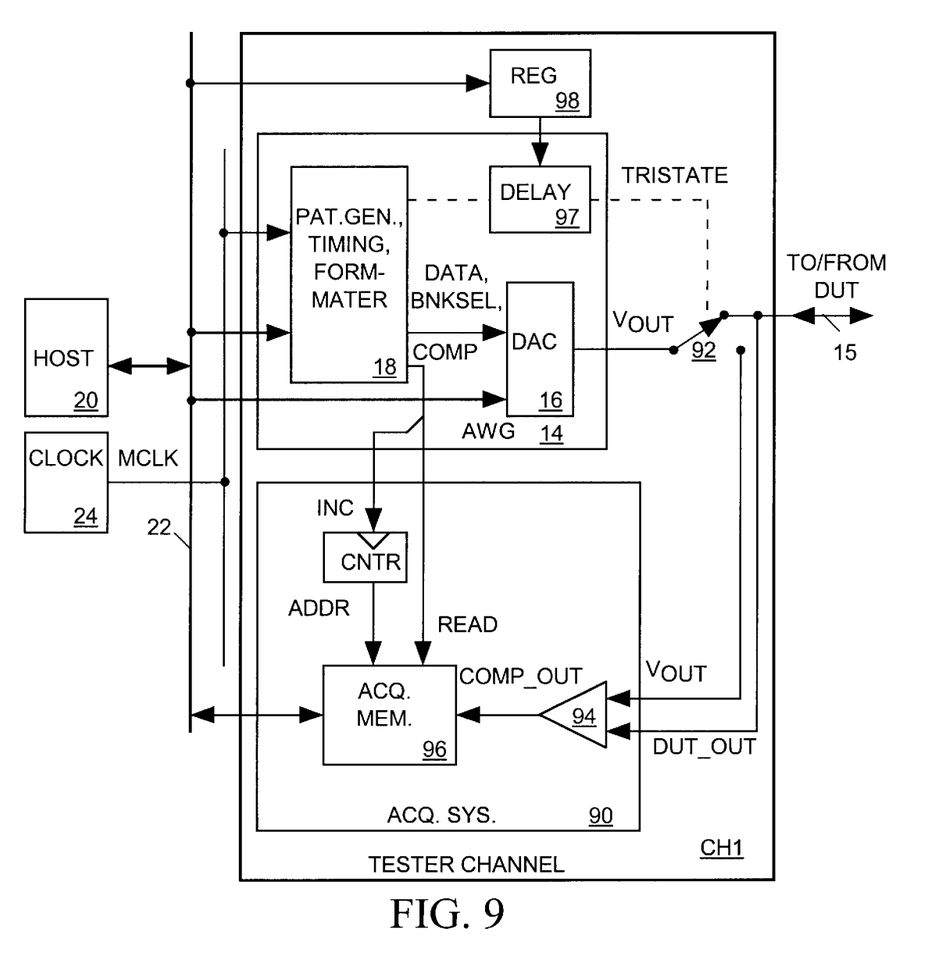
FIGS. 9 and 10 illustrate alternative embodiments of a tester channel of FIG. 1 in block diagram form.

FIG. 9 illustrates an alternative embodiment of tester channel CH1 of FIG. 1 in which an acquisition system 90 can monitor both digital and analog DUT output signals. In this version, a switch 92 connects the output of DAC 16 to the DUT terminal only when the DUT terminal is acting as a DUT input terminal. When the DUT terminal is a DUT output terminal, switch 92 (under control of the TRISTATE output of PGTF 18) routes the output $V_{OUT}$ of DAC 16 to acquisition system 90. A comparator 94 within acquisition system 90 compares the DUT output signal DUT_OUT to $V_{OUT}$ and produces an output signal COMP_OUT indicating whether DUT_OUT is higher or lower in magnitude than $V_{OUT}$. A single-bit signal (INC) of the COMP output of PGTF 18 clocks a counter supplying an address (ADDR) to an acquisition memory 96. Acquisition memory 96 samples and stores a bit representing the state of the COMP_OUT in response to a READ signal input, another of the COMP data output of PGTF 18.

In order to determine if DUT_OUT is within, above or below a particular range, PGTF 18 signals DAC 16 to produce a sequence of two $V_{OUT}$ values matching upper and lower limits of the range and signals acquisition memory 96 to acquire the COMP_OUT data bit once for each of the two $V_{OUT}$ values. The two bits of data acquisition memory 96 thus acquires indicate whether DUT_OUT is within, above or below the range defined by the two successive values of $V_{OUT}$.

In this embodiment of the invention, since switch 92 disconnects DAC 16 from the DUT when the DUT is producing output signal DUT_OUT, we do not want to internally tristate the output of DAC 16 when the DUT is producing output signal DUT_OUT since the $V_{OUT}$ signal is then needed as an input to acquisition system 90. Thus the switch SWC of the DAC 16 (FIG. 2) is eliminated. The TRISTATE output of PGTF 18 is instead used to control switch 92 of FIG. 9. A programmable delay circuit 97 delays the TRISTATE signal controlling switch 92 with delay determined by data host computer 20 stores in a register 98, thereby allowing host computer 20 to separately calibrate the arrival time of the TRISTATE signal at switch 92 for all channels.

Figure 10:
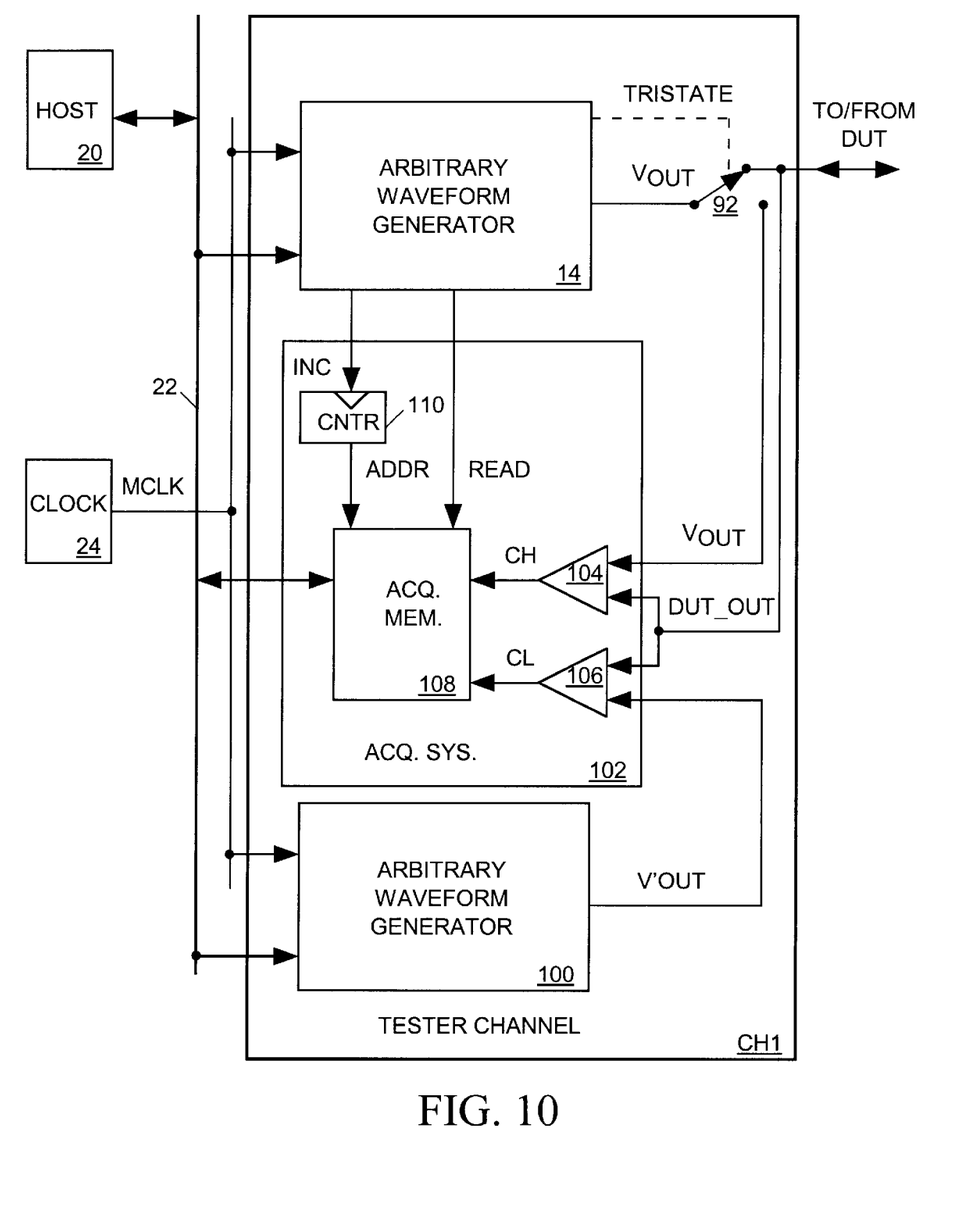

FIG. 10 illustrates another version of tester channel CH1 somewhat similar to the version of FIG. 9 but in which the tester channel is provided with a second AWG 100 similar to AWG 14 for producing a second waveform V'$_{OUT}$ that may be lower in voltage than V$_{OUT}$ so that at any given time the magnitudes of V$_{OUT}$ and V'$_{OUT}$ define ends of a range of expected voltages for DUT_OUT. An acquisition system 102 is provided with two comparators 104 and 106, for respectively comparing V$_{OUT}$ and V'$_{OUT}$ to DUT_OUT. Comparator 104 produces an output bit CH indicating whether DUT_OUT is higher than V$_{OUT}$ while comparator 106 produces an output bit indicating whether DUT_OUT is higher than V'$_{OUT}$. An acquisition memory 108 addressed by a counter 110 stores the CH and CL bits in response to a READ signal from AWG 14 with counter 110 incrementing the memory address (ADDR) in response to an INC signal from AWG 14. The additional AWG 100 allows tester channel version of FIG. 10 to produce data CH, CL indicating whether the DUT_OUT magnitude is within an expected range in a single digitization pass whereas the tester channel version of FIG. 9 requires two digitization passes to collect the same data.

Thus has been shown and described an IC tester in accordance with the invention employing an arbitrary waveform generator for producing a test signal input to an IC device under test that may be act either as an analog or digital test signal. In accordance with alternative embodiments of the invention, the tester also employs the output signal of the AWG as a reference for determining whether a DUT output signal voltage is within an expected range. The AWG employs a DAC in accordance with the invention that linearly ramps its output voltage between successive levels with a programmable slew rate to provide an output waveform than can closely approximate a smoothly varying analog signal without need for filtering.

While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. An arbitrary waveform generator (AWG) for generating an AWG output signal (VOUT) having a time varying magnitude, the AWG comprising:
    means (18,24) for generating a sequence of waveform data words (DATA) having multiple bits (D1–DN); and
    a digital-to-analog converter (DAC) for receiving said sequence of waveform data words and for producing said AWG output signal in response thereto, wherein said DAC comprises:
        a plurality of DAC units (U1–UN), each receiving a separate bit of each said waveform data word and each generating a separate first ramp signal (I1SRC–INSRC) that ramps linearly between differing first and second magnitudes in response to a change of state of said separate bit; and
    output stage means (38) for producing said DAC output signal in response to a combination of first ramp signals produced by said plurality of ramp generators.

2. The AWG in accordance with claim 1
    wherein said first and second magnitudes of said first ramp signal of each DAC unit are current magnitudes; and
    wherein said output stage means produces said DAC output signal in response to a sum of all first ramp signals generated by said DAC units.

3. The AWG in accordance with claim 2 wherein said output stage (38) comprises:
    a circuit node (H) for receiving and summing the first ramp signal produced by all of said DAC units to produce a current (I$_{OUT}$);
    a voltage source (57);
    an impedance element (R4); and
    switch means (SWC) controlled by a digital input signal (TRISTATE), said switch means and said impedance element being connected in series between said circuit node and said voltage source,
        wherein said DAC output signal is produced at said circuit node.

4. The AWG in accordance with claim 1 wherein each DAC unit comprises:
    a ramp generator (30) for generating said first ramp signal (I1SRC–INSRC) ramping linearly between said first and second magnitudes in response to a change in state of said separate bit, wherein said first and second magnitudes are programmably determined by control signals (33,35) supplied as input thereto; and
    means (31,32) for receiving control data and for producing and supplying said control signals to said ramp generator in response to said control data.

5. The AWG in accordance with claim 4 wherein said ramp generator ramps said first ramp signal between said first and second magnitudes at a rate also determined by said control signals.

6. The AWG in accordance with claim 1 wherein each of DAC units comprises:
    a ramp generator (30) for generating said first ramp signal ramping linearly between said first and second magnitudes in response to a change in state of said separate bit, wherein said first and second magnitudes are programmably determined by control signals (33,35) supplied as input thereto; and
    means (31,32) for receiving and storing multiple sets of control data, for selecting one set of said multiple sets of control data in response to input selection data (BNKSEL), and for producing and supplying said control signals to said ramp generator in response to the selected one set of control data.

7. The AWG in accordance with claim 6 wherein said ramp generator ramps said first ramp signal between said first and second magnitudes at a rate also determined by said control signals.

8. The AWG in accordance with claim 1
    wherein each of said DAC units also generates a second ramp signal (I1SNK–INSNK) ramping linearly between differing third and fourth magnitudes in response to said change in state of said separate bit,
    wherein said first and second ramp signals ramp in opposite directions, and
    wherein said output stage means (38) produces said DAC output signal in response to a combination of the first and second ramp signals produced by all of said plurality of ramp generators.

9. The AWG in accordance with claim 1
    wherein the first and second magnitudes of said first ramp signal of each DAC unit and the third and fourth magnitudes of the second ramp signal of each DAC unit are current magnitudes; and
    wherein said output stage means produces a current (I$_{OUT}$) by summing first and second ramp signals produced by said DAC units and produces said DAC output signal in response to said current.

10. The AWG in accordance with claim 1 wherein said means for generating a sequence of waveform data words having multiple bits comprises:

means (24) for generating a clock signal (MCLK) having periodic pulses;

means (80) for generating a vector (VECTOR) in response to each pulse of said clock signal; and means (82, 84, 86 and 88) for receiving each said vector and for producing a corresponding one of said waveform data words in response thereto, wherein a state of each bit of the produced waveform data word is determined by a value of said vector.

11. The AWG in accordance with claim 10 wherein said means for receiving each said vector and for producing a corresponding one of said waveform data words in response thereto also receives pulses of said clock signal and produces said corresponding one of said waveform data words at a time relative to timing of receipt of one pulse of said clock signal also determined by said value of said vector.

* * * * *